United States Patent
Kim et al.

(10) Patent No.: US 11,557,749 B2
(45) Date of Patent: Jan. 17, 2023

(54) LIGHT CONTROL PANEL AND DISPLAY DEVICE INCLUDING 1HE SAME

(71) Applicant: SAMSUNG DISPLAY CO., LTD., Yongin-si (KR)

(72) Inventors: Jae Hong Kim, Yongin-si (KR); Sun Hwa Kim, Yongin-si (KR); Hyang Yul Kim, Yongin-si (KR); Hyo Min Kim, Yongin-si (KR); Hyun Ho Jung, Yongin-si (KR); Hee Seong Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 170 days.

(21) Appl. No.: 16/939,412

(22) Filed: Jul. 27, 2020

(65) Prior Publication Data

US 2021/0193971 A1  Jun. 24, 2021

(30) Foreign Application Priority Data

Dec. 19, 2019 (KR) .......................... 10-2019-0170955

(51) Int. Cl.
*H01L 51/52* (2006.01)
*H01L 27/32* (2006.01)

(52) U.S. Cl.
CPC ...... *H01L 51/5284* (2013.01); *H01L 27/3244* (2013.01); *H01L 51/524* (2013.01)

(58) Field of Classification Search
CPC ............. H01L 27/3244; H01L 27/3246; H01L 27/3258; H01L 27/3272; H01L 27/32; H01L 51/5284; H01L 51/524; H01L 51/5281; H01L 51/5275
See application file for complete search history.

(56) References Cited

U.S. PATENT DOCUMENTS

| 7,719,763 B2 | 5/2010 | Yamashita et al. |
| 9,335,449 B2 | 6/2016 | Gaides et al. |
| 9,740,018 B1 | 8/2017 | Ouderkirk et al. |
| 2009/0273853 A1 | 11/2009 | Park et al. |
| 2014/0192416 A1* | 7/2014 | Wang .................. H04M 1/0266 359/609 |
| 2016/0077328 A1* | 3/2016 | Chong ..................... G02B 3/14 359/291 |
| 2018/0006272 A1* | 1/2018 | Lee ........................ G06F 3/0412 |
| 2020/0168844 A1* | 5/2020 | Kim ..................... H01L 51/5271 |

FOREIGN PATENT DOCUMENTS

| KR | 10-2008-0020271 | 3/2008 |
| KR | 10-1830889 | 2/2018 |
| KR | 10-2019-0053571 | 5/2019 |

* cited by examiner

*Primary Examiner* — Andres Munoz
(74) *Attorney, Agent, or Firm* — F. Chau & Associates, LLC

(57) ABSTRACT

A light control panel includes: a first substrate; a light control layer that includes first light blocking parts and second light blocking parts that are disposed on the first substrate, extend along a first direction, and are spaced apart from each other along a second direction that crosses the first direction; and a second substrate disposed on the light control layer. The first light blocking parts and the second light blocking part are alternately arranged along the second direction. A first width of each of the first light blocking parts in the second direction and a second width of each of the second light blocking parts in the second direction differ from each other.

20 Claims, 7 Drawing Sheets

LIGHT CONTROL PANEL AND DISPLAY DEVICE INCLUDING THE SAME

CROSS-REFERENCE TO RELATED APPLICATION

The present application claims priority under 35 U.S.C. § 119(a) from, and the benefit of, Korean patent application 10-2019-0170955, filed on Dec. 19, 2019 in the Korean Intellectual Property Office, the contents of which are herein incorporated by reference in their entirety.

BACKGROUND

1. Technical Field

Embodiments of the present disclosure are directed to a light control panel and a display device that includes the same.

2. Discussion of the Related Art

An organic light emitting display device (OLED device) has come to be regarded as a next-generation display device because of low voltage driving, light weight, slim profile, a wide viewing angle, a high-speed response, etc. In particular, studies on display devices for vehicles have recently been conducted.

A display device for a vehicle includes a light control film (LCF) that controls reflected images by blocking light towards a windshield of the vehicle so as to ensure the safety of a driver.

SUMMARY

Embodiments provide a light control panel that reduces a moire phenomenon and secures various viewing angles, and a display device that includes the light control panel.

In accordance with an embodiment of the present disclosure, there is provided a light control panel that includes: a first substrate; a light control layer that includes first light blocking parts and second light blocking parts that are disposed on the first substrate, extend along a first direction, and are spaced apart from each other along a second direction that crosses the first direction; and a second substrate disposed on the light control layer, where the first light blocking parts and the second light blocking part are alternately arranged along the second direction, where a first width of each of the first light blocking parts in the second direction differs from a second width of each of the second light blocking parts in the second direction.

A first distance in the second direction between a first light blocking part adjacent to a first side of a second light blocking part and the second light blocking part may differ from a second distance in the second direction between another first light blocking part adjacent to a second side of the second light blocking part and the second light blocking part.

Each of the first distance and the second distance may range from 10 μm to 75 μm.

Each of the first width and the second width may range from 5 μm to 20 μm. A ratio of a height of each of the first light blocking parts in a third direction normal to a plane defined by the first and second directions to the first width and a ratio of a height of each of the second light blocking parts in the third direction to the second width may range from 5:1 to 20:1.

The first light blocking parts and the second light blocking parts may include different light absorbing materials.

Each of the first substrate and the second substrate may have a light refractive index that ranges from 1.3 to 1.8.

The light control layer may further include a light transmitting layer disposed between the first substrate and the second substrate. The light transmitting layer may form the light control layer and surround the first light blocking parts and the second light blocking parts.

The light refractive index of the second substrate may be greater than that of the light transmitting layer.

The light control layer may further include third light blocking parts respectively disposed between a first light blocking part and a second light blocking part of adjacent pairs of the first light blocking part LB1 and the second light blocking part LB2.

In accordance with another embodiment of the present disclosure, there is provided a display device including: a light control panel, wherein the light control panel includes: a first substrate; a light control layer that includes first light blocking parts and second light blocking parts that are disposed on the first substrate, extend along a first direction, and are spaced apart from each other along a second direction that crosses the first direction; and a second substrate disposed on the light control layer, where the first light blocking parts and the second light blocking part are alternately arranged along the second direction, where a first distance in the second direction between a first light blocking part adjacent to a first side of a second light blocking part and the second light blocking part differs from a second distance in the second direction between another first light blocking part adjacent to a second side of the second light blocking part and the second light blocking part.

The display device may include a display panel that includes a plurality of pixels, where the light control panel is disposed on the display panel. Each of the pixels may include: a first electrode; a second electrode disposed opposite from the first electrode; and an organic emitting layer disposed between the first electrode and the second electrode.

A first width of each of the first light blocking parts in the second direction may differ from a second width of each of the second light blocking parts in the second direction. Each of the first width and the second width may range from 5 μm to 20 μm.

Each of the first distance and the second distance may range from 10 μm to 75 μm.

A ratio of a height of each of the first light blocking parts in a third direction normal to a plane defined by the first and second directions to the first width and a ratio of a height of each of the second light blocking parts in the third direction to the second width may range from 5:1 to 20:1.

The first substrate and the second substrate may have a light refractive index that ranges from 1.3 to 1.8.

The light control layer may further include a light transmitting layer disposed between the first substrate and the second substrate. The light transmitting layer may form the light control layer and surround the first light blocking parts and the second light blocking parts.

The light refractive index of the second substrate may be greater than that of the light transmitting layer.

The light control layer may further include third light blocking parts respectively disposed between a first light blocking part and a second light blocking part of adjacent pairs of the first light blocking part LB1 and the second light blocking part LB2.

In accordance with another embodiment of the present disclosure, there is provided a light control panel that includes a first substrate; and a light control layer that includes first light blocking parts and second light blocking parts that are alternately disposed on the first substrate, extend along a first direction, and are spaced apart from each other along a second direction that crosses the first direction, where a first width of each of the first light blocking parts in the second direction differs from a second width of each of the second light blocking parts in the second direction, where a ratio of a height of each of the first light blocking parts in a third direction normal to a plane defined by the first and second directions to the first width and a ratio of a height of each of the second light blocking parts in the third direction to the second width range from 5:1 to 20:1.

The light control panel may further include a second substrate disposed on the light control layer. A first distance in the second direction between a first light blocking part adjacent to a first side of a second light blocking part and the second light blocking part differs from a second distance in the second direction between another first light blocking part adjacent to a second side of the second light blocking part and the second light blocking part.

DETAILED DESCRIPTION

Figure 1:
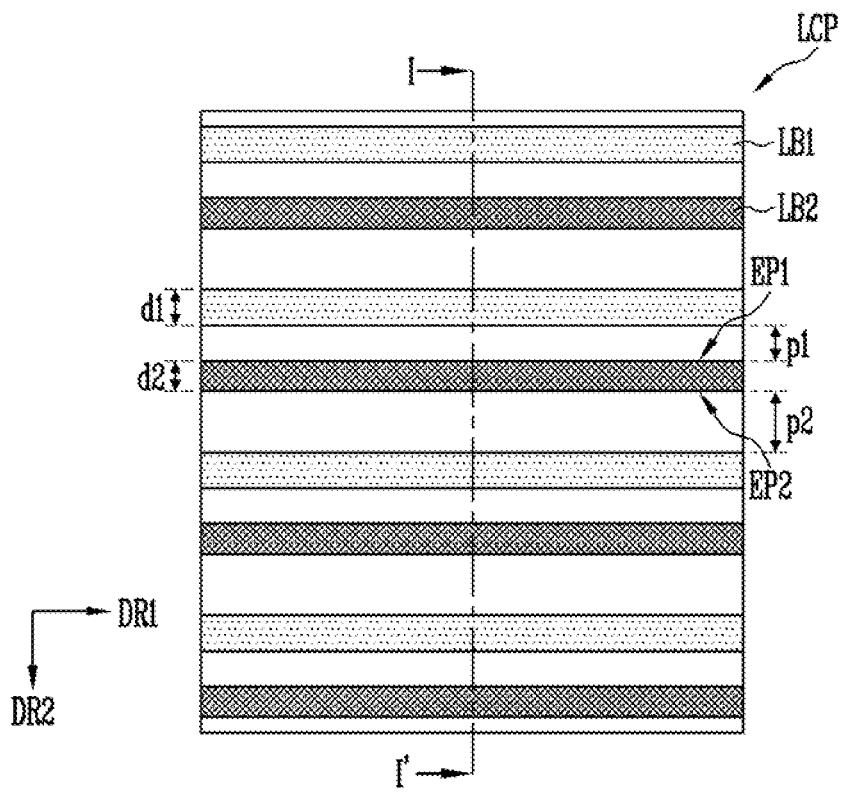
FIG. 1 is a plan view of a light control panel in accordance with an embodiment of the present disclosure.

Exemplary embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it may be the only element between the two elements, or one or more intervening elements may also be present. Like reference numerals may refer to like elements throughout.

Hereinafter, exemplary embodiments of the present disclosure will be described in detail with reference to the accompanying drawings.

Figure 2:
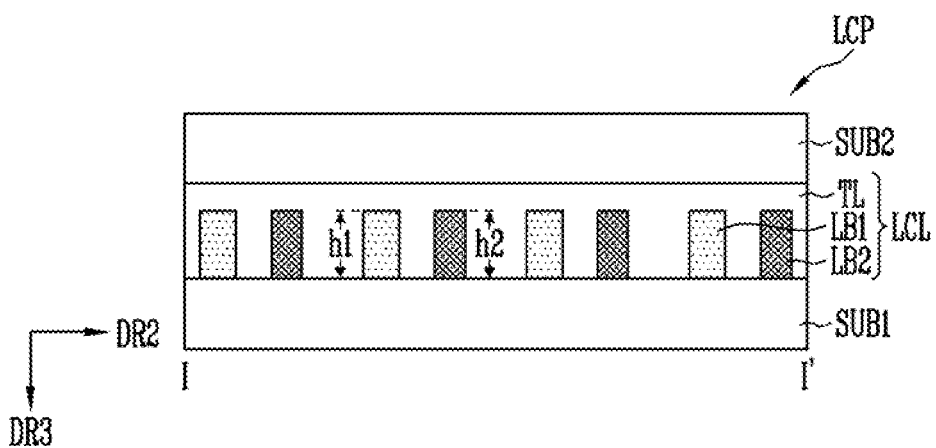
FIG. 2 is a cross sectional view taken along line I-I' in FIG. 1.

FIG. 1 is a plan view of a light control panel in accordance with an embodiment of the present disclosure. FIG. 2 is a sectional view taken along line I-I' shown in FIG. 1.

As shown in FIGS. 1 and 2, according to an embodiment, a light control panel LCP includes a first substrate SUB1, a light control layer LCL, and a second substrate SUB2. The first substrate SUB1, the light control layer LCL, and the second substrate SUB2 are sequentially stacked.

Each of the first and second substrates SUB1 and SUB2 may be a rigid substrate or a flexible substrate.

According to embodiments, a rigid substrate may be one of a glass substrate, a quartz substrate, a glass ceramic substrate, or a crystalline glass substrate.

According to embodiments, a flexible substrate may be one of a film substrate of a plastic substrate, which include a polymer organic material. For example, a flexible substrate may include one of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), or cellulose acetate propionate (CAP). Also, a flexible substrate may include a fiber glass reinforced plastic (FRP).

In various embodiments of the present disclosure, all or at least a portion of each of the first and second substrate SUB1 and SUB2 may be flexible. Each of the first and second substrate SUB1 and SUB2 is a transparent substrate which enables light to be transmitted therethrough. That is, the first and second substrates SUB1 and SUB2 are formed of a transparent material.

In various embodiments of the present disclosure, the light control layer LCL includes first light blocking parts LB1 and second light blocking parts LB2. The first light blocking parts LB1 and the second light blocking parts LB2 extend along a first direction DR1 on the first substrate SUB1. In addition, the first light blocking parts LB1 and the second light blocking parts LB2 are spaced apart from each other along a second direction DR2 that is substantially perpendicular to the first direction.

Referring to FIGS. 1 and 2, according to embodiments, the first light blocking parts LB1 and the second light blocking parts LB2 alternate with each other along the second direction DR2. Each of the first light blocking parts LB1 has a first width d1 along the second direction DR2. The first light blocking parts LB1 may all have the same first width d1, but embodiments of the present disclosure are not limited thereto. For example, in other embodiments, the first light blocking parts LB1 have different first widths d1.

According to embodiments, each of the second light blocking parts LB2 has a second width d2 along the second direction DR2. The second light blocking parts LB2 may all have the same second width d2, but embodiments of the present disclosure are not limited thereto. For example, in other embodiments, the second light blocking parts LB2 have different second widths d2.

In various embodiments, the first width d1 of the first light blocking parts LB1 and the second width d2 of the second light blocking parts LB2 differ from each other. The first light blocking parts LB1 and the second light blocking parts LB2 are alternately disposed on the first substrate SUB1, and the first width d1 of the first light blocking parts LB1 and the second width d2 of the second light blocking parts LB2 differ from each other, so that a moire phenomenon can be suppressed when the light control panel LCP is incorporated into a display panel, and so that a viewing angle of the light control panel LCP can be variously controlled.

In various embodiments, each of the first width d1 and the second width d2 is from about 5 µm to about 20 µm. Specifically, the first width d1 of the first light blocking parts LB1 may range from 5 µm to 20 µm, from 10 µm to 18 µm, from 15 µm to 17 µm, or from 16 µm to 20 µm. In addition, the second width d2 of the second light blocking parts LB2 may range from 5 µm to 20 µm, from 8 µm to 15 µm, from 10 µm to 14 µm, or from 15 µm to 18 µm.

According to embodiments, when the first width d1 of the first light blocking parts LB1 and the second width d2 of the second light blocking parts LB2 are within the above-described ranges, the viewing angle of the light control panel LCP can be more variously secured. Further, when the first width d1 of the first light blocking parts LB1 and the second width d2 of the second light blocking parts LB2 are controlled within those ranges, a moire phenomenon that may occur when the light control panel LCP is incorporated into a display panel can be reduced.

Although an embodiment in which the first width d1 of the first light blocking parts LB1 is greater than the second width d2 of the second light blocking parts LB2 Is Illustrated in FIGS. 1 and 2, embodiments of the present disclosure are not limited thereto. In other embodiments, unlike those shown in FIGS. 1 and 2, the first width d1 of the first light blocking is less than the second width d2 of the second light blocking parts LB2.

According to embodiments, as shown in FIGS. 1 and 2, the first light blocking parts LB1 and the second light blocking parts LB2 are alternately arranged, and hence one second light blocking part LB2 is disposed between two adjacent first light blocking parts LB1. Similarly, one first light blocking part LB1 is disposed between two adjacent second light blocking parts LB2.

According to embodiments, a first light blocking part LB1 adjacent to a first side portion EP1 of a second light blocking part LB2 and the second light blocking part LB2 are spaced apart from each other by a first distance p1 in the second direction DR2. In addition, another first light blocking part LB1 adjacent to a second side portion EP2 of the second light blocking part LB2 and the second light blocking part LB2 are spaced apart from each other by a second distance p2 in the second direction DR2.

In other words, according to embodiments, any one first light blocking part LB1 that is adjacent to a first side EP1 of the second light blocking part LB2 and the second light blocking part LB2 are spaced apart from each other by the first distance p1 in the second direction DR2. In addition, another first light blocking part LB1 that is adjacent to a second side EP2 of the second light blocking part LB2 and the second light blocking part LB2 are spaced apart from each other by the second distance p2 in the second direction DR2. In other words, a first light blocking part LB1 that faces a first side EP1 of the second light blocking part LB2 and the second light blocking part LB2 are spaced apart from each other by the first distance p1 in the second direction DR2. In addition, another first light blocking part LB1 that faces a second side EP2 of the second light blocking part LB2 and the second light blocking part LB2 are spaced apart from each other by the second distance p2 in the second direction DR2. The first distance p1 and the second distance p2 differ from each other. As shown in FIGS. 1 and 2, the first distance p1 is less than the second distance p2. However, embodiments of the present disclosure are not limited thereto. For example, in other embodiments, the first distance p1 is greater than the second distance p2.

According to embodiments, the first and second distances p1 and p2 between the first and second light blocking parts LB1 and LB2 differ from each other, so that a moire phenomenon is suppressed when the light control panel LCP is incorporated into a display panel, and so that a viewing angle of the light control panel LCP can be variously controlled.

In various embodiments of the present disclosure, each of the first and second distances p1 and p2 range from 10 µm to 75 µm. Specifically, the first distance p1 may range from 20 µm to 70 µm, from 30 µm to 60 µm, or from 35 µm to 55 µm. In addition, the second distance p2 may range from 15 µm to 65 µm, from 25 µm to 50 µm, or from 30 µm to 45 µm.

According to embodiments, by controlling the first and second distances p1 and p2 to be within the above-described ranges, a moire phenomenon is suppressed when the light control panel LCP is incorporated into a display panel.

Referring to FIG. 2, according to embodiments, each of the first light blocking parts LB1 has a first height h1 in a third direction DR3 that is normal to a plane defined by the first and second directions DR1, DR2. The first light blocking parts LB1 have the same first height h1, but embodiments of the present disclosure are not limited thereto. For example, in other embodiments, the first light blocking parts LB1 have different first heights h1.

According to embodiments, each of the second light blocking parts LB2 has a second height h2 in the third direction DR3. The second light blocking parts LB2 have the same second height h2, but embodiments of the present disclosure are not limited thereto. For example, in other embodiments, the second light blocking parts LB2 have different second heights h2.

In various embodiments of the present disclosure, a ratio of the first height h1 to the first width d1 of each of the first light blocking parts LB1 ranges from 5:1 to 20:1. Specifically, a ratio of the first height h1 to the first width d1 of each of the first light blocking parts LB1 may range from 7:1 to 18:1 or from 10:1 to 15:1. In addition, a ratio of the second height h2 to the second width d2 of each of the second light blocking parts LB2 ranges from 5:1 to 20:1. Specifically, a ratio of the second height h2 to the second width d2 of each of the second light blocking parts LB2 may range from 7:1 to 18:1 or from 10:1 to 15:1.

According to embodiments, when the ratio of the first height h1 to the first width d1 of each of the first light blocking parts LB1 and the ratio of the second height h2 to the second width d2 of each of the second light blocking parts LB2 are controlled within the above-described range, the viewing angle of the light control panel LCP can be more variously secured.

In various embodiments of the present disclosure, the first light blocking parts LB1 and the second light blocking parts LB2 include a light absorbing material. By including a light absorbing material, the first light blocking parts LB1 and the second light blocking parts LB2 can block light from being transmitted therethrough. The first and second light blocking parts LB1 and LB2 are formed of an opaque material.

According to embodiments, light absorbing materials known in the art can be adopted and used without limit in the first and second light blocking parts LB1 and LB2. For example, the light absorbing material may include a dark colored pigment such as a black pigment or a gray pigment, a dark colored dye, a metal such as aluminum or silver, a metal oxide, or a dark colored polymer, etc.

In various embodiments of the present disclosure, different light absorbing materials are included in the first light blocking parts LB1 and the second light blocking parts LB2. The first light blocking parts LB1 and the second light blocking parts LB2 include different light absorbing materials, so that a moire phenomenon that may occur when the light control panel LCP is incorporated into a display panel can be further reduced.

However, according to embodiments, depending on a design of the light control panel LCP, the same light absorbing material may be included in the first light blocking parts LB1 and the second light blocking parts LB2.

In various embodiments of the present disclosure, the light control layer LCL includes a light transmitting layer TL disposed between the first substrate SUB1 and the second substrate SUB2. The light transmitting layer TL allows light to be transmitted therethrough, and Includes a transparent resin. For example, the light transmitting layer TL may include one of polyethersufone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), or cellulose acetate propionate (CAP).

As shown in FIG. 2, according to embodiments, the light transmitting layer TL is disposed between the first substrate SUB1 and the second substrate SUB2 in the third direction DR3. The light transmitting layer TL substantially completely fills spaces between the first and second light blocking parts LB1 and LB2 disposed on the first substrate SUB1, and forms a layer between top surfaces of the first and second light blocking parts LB1 and LB2 and the second substrate SUB2. That is, the first and second light blocking parts LB1 and LB2 are disposed in the light transmitting layer TL.

Through a method used in the art, the first and second light blocking parts LB1 and LB2 are disposed in the light transmitting layer TL. For example, an adhesive layer may be disposed on the first substrate SUB1, and the first and second light blocking parts LB1 and LB2 may be attached onto the adhesive layer. Subsequently, a transparent resin composition is disposed onto the adhesive layer onto which the first and second light blocking parts LB1 and LB2 are attached, and the light transmitting layer TL is formed by curing the transparent resin composition.

In another example, a transparent resin composition is applied onto a release film and then imprinted using a mold in which the shape of the first and second light blocking parts LB1 and LB2 is embossed. The light transmitting layer TL is formed by curing the transparent resin composition in the imprinting process. Subsequently, the first and second light blocking parts LB1 and LB2 are formed by removing the mold, filling an engraved pattern formed in the light transmitting layer TL with a light absorbing material, and curing the light absorbing material. The light transmitting layer TL in which the first and second light blocking parts LB1 and LB2 are provided is adhered to the first substrate SUB1.

In various embodiments of the present disclosure, each of the first substrate SUB1 and the second substrate SUB2 has a light refractive index between 1.3 and 1.8. When the substrate SUB1 is attached to a display panel which will be described below, the light refractive index of the second substrate SUB2 is greater than that of the first substrate SUB1.

In various embodiments of the present disclosure, the light transmitting layer TL has a light refractive index that ranges from 1.3 to 1.8. In addition, the light refractive index of the second substrate SUB2 is greater than that of the light transmitting layer TL. Specifically, when the substrate SUB1 is attached to a display panel which will be described below, the light refractive index of the second substrate SUB2 is greater than that of the light transmitting layer TL.

According to embodiments, when the light control panel is incorporated into a display device, the light refractive index of the second substrate SUB2 disposed at an outermost portion is greater than that of the light transmitting layer TL, so that a viewing angle of the display device that includes the light control panel LCP can be more easily secured.

Figure 3:
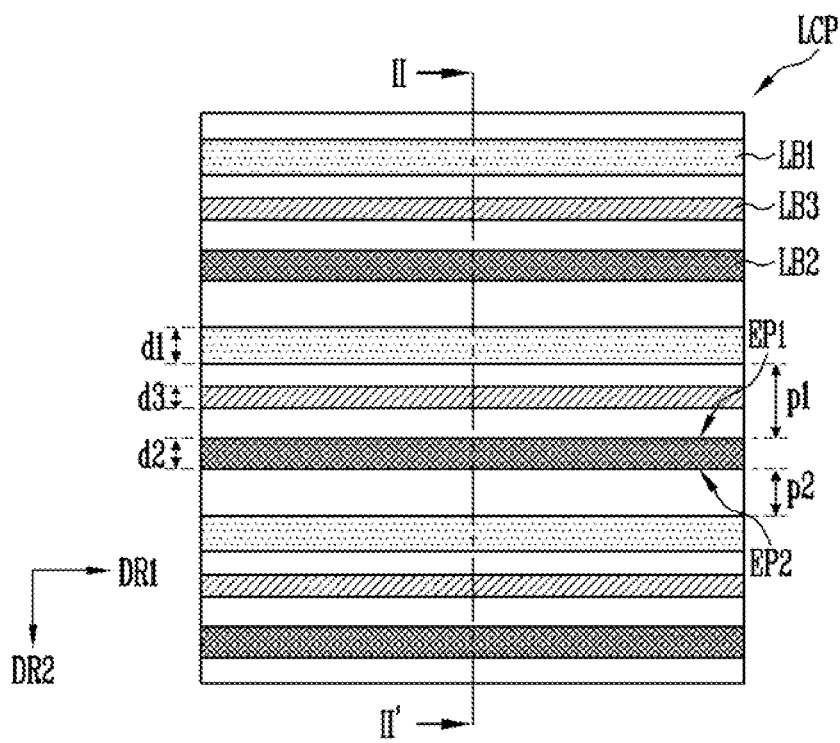
FIG. 3 is a plan view of light control panel in accordance with another embodiment of the present disclosure.
Figure 4:
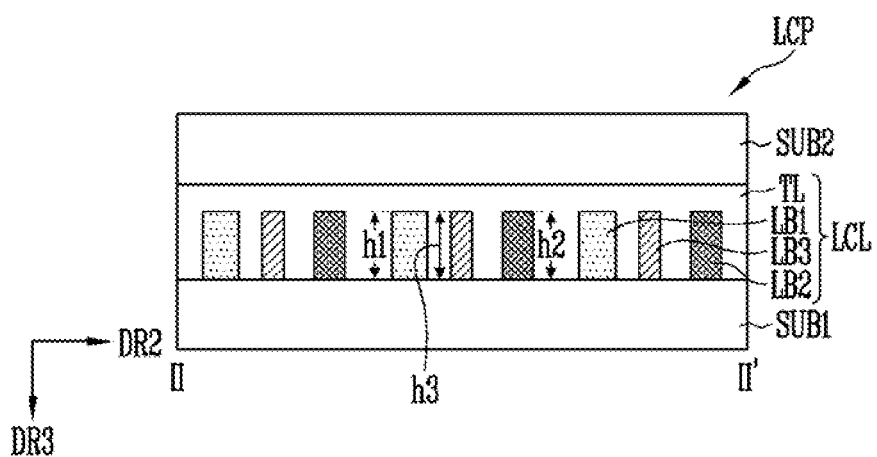
FIG. 4 is a cross sectional view taken along line II-II' in FIG. 3.

FIG. 3 is a plan view of a light control panel in accordance with another embodiment of the present disclosure. FIG. 4 is a sectional view taken along line II-II' in FIG. 3.

In an embodiment, portions different from those of an above-described embodiment will be mainly described to avoid redundancy. Portions not particularly described in this embodiment follow those of the above-described embodiment. In addition, identical reference numerals refer to identical components, and similar reference numerals refer to similar components. This is the same as embodiments which will be described below.

As shown in FIGS. 3 and 4, according to embodiments, the light control panel LCP include a first substrate SUB1, a light control layer LCL, and a second substrate SUB2 that are sequentially stacked. The light control layer LCL includes a light transmitting layer TL, first light blocking parts LB1, second light blocking parts LB2, and third light blocking parts LB3.

Referring to FIGS. 3 and 4, according to embodiments, the third light blocking parts LB3 extend along the first direction DR1 on the first substrate SUB1. In addition, the third light blocking parts LB3 are spaced apart from the first and second light blocking parts LB1 and LB2 in the second direction DR2.

As shown in FIGS. 3 and 4, according to embodiments, the first light blocking part LB1 and the second light blocking part LB2 are alternately disposed, and the third light blocking parts LB3 are disposed between a first light blocking part LB1 and a second light blocking part LB2 of adjacent pairs of the first light blocking part LB1 and the second light blocking part LB2.

In various embodiments of the present disclosure, a first distance p1 between a first light blocking part LB1 and a second light blocking part LB2 between which a third light blocking part LB3 is disposed is greater than a second distance p2 between a first light blocking part LB1 and a second light blocking part LB2 between which no third light blocking part LB3 is disposed.

In various embodiments of the present disclosure, each of the third light blocking parts LB3 has a third width d3 in the second direction DR2. The third light blocking parts LB3 have the same third width d3, but embodiments of the present disclosure are not limited thereto. For example, In other embodiments, the third light blocking parts LB3 have different third widths d3.

According to embodiments, the third width d3 of the third light blocking parts LB3 differs from the first width d1 of the first light blocking parts LB1 and the second width of the second light blocking parts LB2. The third width d3 of the third light blocking parts LB3 differs from the first width d1 and the second width d2, so that a moire phenomenon can be suppressed when the light control panel LCP is incorporated into a display panel, and so that a viewing angle of the light control panel LCP can be variously controlled.

In various embodiments of the present disclosure, the third width of the third light blocking parts LB3 ranges from 5 μm to 20 μm. Specifically, the third width d3 of the third light blocking parts LB3 may range from 5 μm to 10 μm, or from 12 μm to 16 μm.

Referring to FIG. 4, according to embodiments, each of the third light blocking parts LB3 has a third height h3 in the third direction DR3 on the first substrate SUB1. The third light blocking parts LB3 have the same third height h3, but embodiments of the present disclosure are not limited thereto. For example, in other embodiments, the third light blocking parts LB3 have different third heights h3.

In various embodiments of the present disclosure, a ratio of the third height h3 to the third width d3 of each of the third light blocking parts LB3 ranges from 5:1 to 20:1. Specifically, the ratio of the third height h3 to the third width d3 of each of the third light blocking parts LB3 may range from 7:1 to 18:1 or from 10:1 to 15:1.

As shown in FIGS. 3 and 4, according to embodiments, a third light blocking part LB3 is disposed between a first light blocking part LB1 and a second light blocking part LB2 of adjacent pairs of a first light blocking part LB1 and a second light blocking part LB2. The third light blocking part LB3 is disposed between a first light blocking part LB1 and a second light blocking part LB2 of adjacent pairs of a first light blocking part LB1 and a second light blocking part LB2, so that a moire phenomenon can be suppressed when the light control panel LCP is incorporated into a display panel.

Figure 5:
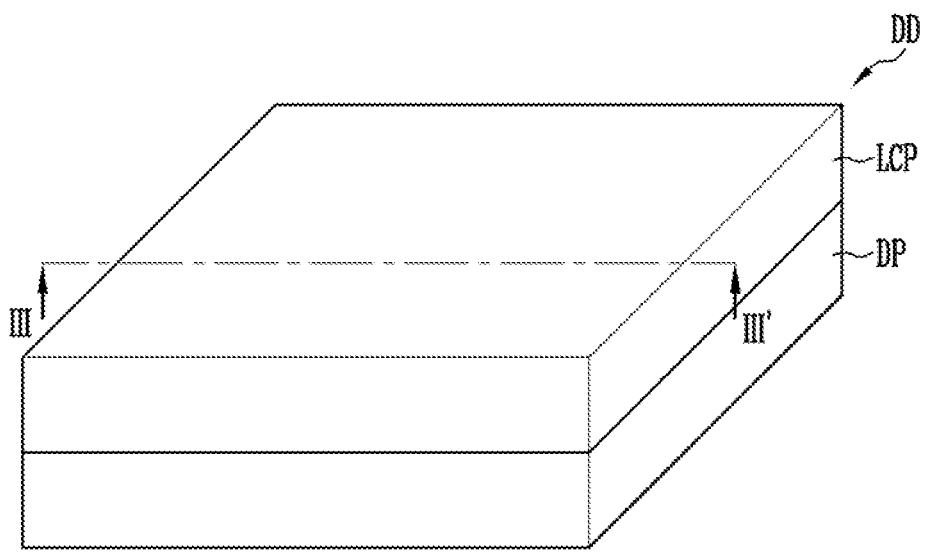
FIG. 5 is a perspective view of a display device in accordance with an embodiment of the present disclosure.
Figure 6:
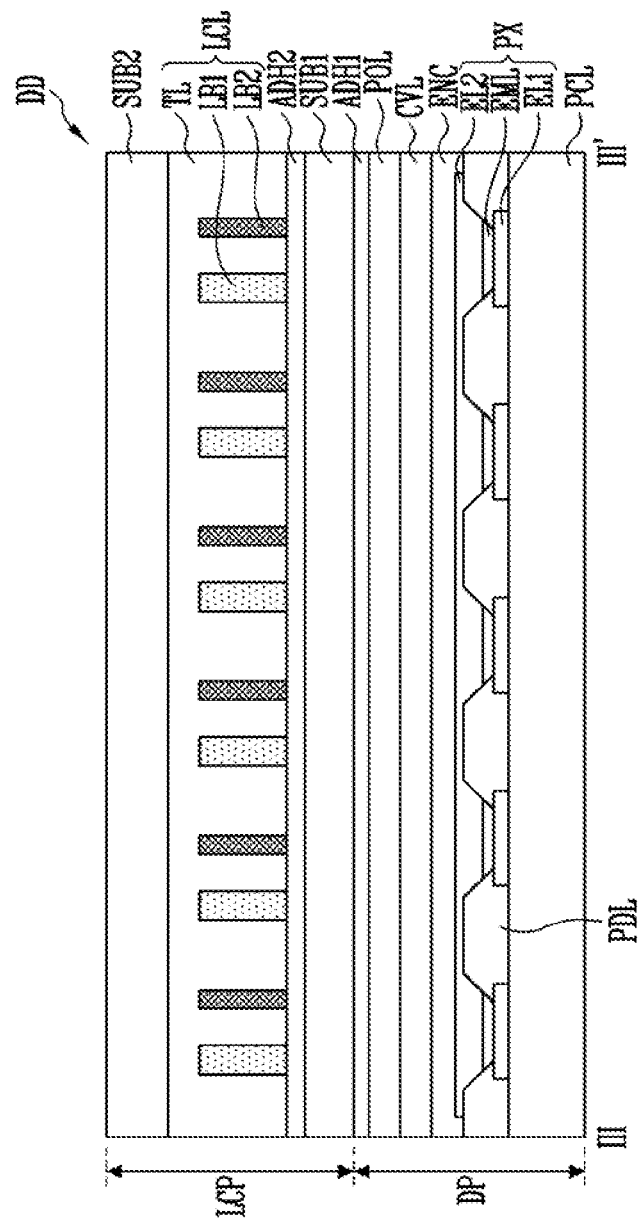
FIG. 6 is a sectional view taken along line III-III' in FIG. 5.

FIG. 5 is a perspective view of a display device in accordance with an embodiment of the present disclosure. FIG. 6 is a sectional view taken along line III-III' in FIG. 5.

Referring to FIGS. 5 and 6, according to embodiments, the display device DD includes a display panel DP and a light control panel LCP. The light control panel LCL is disposed on a light emitting surface of the display panel DP from which light emitted from pixels in the display panel are radiated.

As shown in FIG. 6, according to embodiments, the display panel DP includes a pixel circuit layer PCL, a plurality of pixels PX, an encapsulation layer ENC, a cover layer CVL, a polarizing layer POL, and a first adhesive layer ADH1. The display panel DP includes a display region and a non-display region provided at the periphery of the display region.

According to embodiments, the plurality of pixels PX are provided in the display region of the display panel DP. A drive unit that drives the pixels and a portion of line unit that connects the pixels PX and the drive unit are disposed in the non-display region of the display panel DP.

According to embodiments, each of the plurality of pixels PX is a unit for displaying an image. The pixels PX emit white or colored light. Each pixel PX emits one of red, green or blue light, but embodiments of the present disclosure are not limited thereto. For example, in other embodiments, each pixel PX emits one of cyan, magenta, yellow or white light.

According to embodiments, the plurality of pixels PX are arranged in a matrix form. However, embodiments of the present disclosure are not limited thereto, and in other embodiments, the pixels PX are arranged in various other forms.

According to embodiments, each of the pixels PX includes a display element connected to a thin film transistor. The display element may be any one of a liquid crystal display element (LCD element), an electrophoretic display element (EPD element), an electrowetting display element (EWD element), or an organic light emitting display element (OLED element). Hereinafter, for convenience of description, a case where the OLED element is used as the display element is described as an example.

In various embodiments of the present disclosure, each of the pixels PX includes a first electrode EL1, a second electrode EL2 opposite the first electrode EL1, and an organic emitting layer EML disposed between the first electrode EL1 and the second electrode EL2.

As shown in FIG. 6, according to embodiments, the first electrode EL1 is disposed on the pixel circuit layer PCL, the organic emitting layer EML is disposed on the first electrode EL1, and the second electrode EL2 is disposed on the organic emitting layer EML.

According to embodiments, the first electrode EL1 includes a reflective layer that includes one or more of gold (Au), platinum (Pt), nickel (Ni), tungsten (W), chromium (Cr), molybdenum (Mo), iron (Fe), cobalt (Co), copper (Cu), palladium (Pd), or titanium (Ti), or compounds thereof. The first electrode EL1 further includes a transparent layer that has a high work function, which is formed on the reflective layer. The transparent layer includes one of indium tin oxide (ITO) or indium zinc oxide (IZO), etc. In addition, the first electrode EL1 may include various other materials known in the art. The first electrode EL1 is an anode electrode.

According to embodiments, the second electrode EL2 is a transmissive electrode. For example, the second electrode EL2 is formed with a semi-transmissive layer thinly formed using metals that have a low work function, such as alkali metals such as lithium (Li) or cesium (Cs), alkali earth metals such as magnesium (Mg), calcium (Ca), or strontium (Sr), or compounds thereof. The second electrode EL2 further includes a transparent conductive layer formed on the top or bottom of the metallic semi-transmissive layer. The transparent conductive layer includes indium tin oxide (ITO) or indium zinc oxide (IZO), etc. The second electrode EL2 is a cathode electrode.

According to embodiments, the organic emitting layer EML is disposed between the first electrode EL1 and the second electrode EL2. A hole transport layer and a hole injection layer may be formed between the first electrode EL1 and the organic emitting layer EML. In addition, an electron transport layer and an electron injection layer may be formed between the organic emitting layer EML and the second electrode EL2. The organic emitting layer EML includes one of a red emitting layer, a green emitting layer, or a blue emitting layer.

According to embodiments, the pixel circuit layer PCL includes a driving transistor, a switching transistor, a storage capacitor, etc. The driving transistor Includes a semiconductor layer, a gate electrode, a source electrode, and a drain electrode. The first electrode EL1 is electrically connected to the drain electrode of the driving transistor in the pixel circuit layer PCL.

Referring to FIG. 6, according to embodiments, a pixel defining layer PDL is disposed between the first electrodes EL1 that overlaps ends of the plurality of first electrodes EL1 to define a sub-pixel region in the first electrode EL1, For example, the sub-pixel region corresponds to the organic emitting layer EML between adjacent pixel defining layers PDL.

According to embodiments, the sub-pixel regions defined by the pixel defining layer PDL output different colors. For example, a sub-pixel region that includes a red emitting layer emits red light, a sub-pixel region that includes a green emitting layer emits green light, and a sub-pixel region that includes a blue emitting layer emits blue light are sequentially arranged.

As shown in FIG. 6, according to embodiments, the display panel DP includes an encapsulation layer ENC disposed on the second electrode EL2. The encapsulation layer ENC is formed of a transparent material such that light emitted from the pixels PX is transmitted therethrough.

According to embodiments, the encapsulation layer ENC may include glass, a transparent film, or an organic layer. In addition, the encapsulation layer ENC includes a plurality of organic layers and a plurality of inorganic layers, which are alternately stacked. For example, in some embodiments, the encapsulation layer ENC has a structure in which the organic layers and the inorganic layers are alternately stacked.

Referring to FIG. 6, according to embodiments, the display panel DP includes a cover layer CVL disposed on the encapsulation layer ENC, a polarizing layer POL disposed on the cover layer CVL, and a first adhesive layer ADH1 disposed on the polarizing layer POL. The cover layer CVL is formed of a transparent material such that light emitted from the pixels PX Is transmitted therethrough. The cover layer CVL prevents oxygen, moisture, etc., from penetrating into the pixels.

According to embodiments, the polarizing layer POL is a polarizing film or a polarizing plate. In some embodiments, the polarizing layer POL is replaced with a color filter. The polarizing layer POL prevents reflection of external light, so that the visibility of light emitted from each pixel can be increased.

According to embodiments, the first adhesive layer ADH1 is an optically clear adhesive (OCA) that allows light to be transmitted therethrough. The first adhesive layer ADH1 has a light refractive index from 1.3 to 1.8.

As shown in FIGS. 5 and 6, according to embodiments, the light control panel LCP is disposed on the display panel DP. Specifically, the first substrate SUB1 of the light control panel LCP is attached onto the first adhesive layer ADH1 of the display panel DP. The light control panel LCP of the display device DD is the light display panel LCP described with reference to FIGS. 1 to 4.

Referring to FIG. 6, according to embodiments, a second adhesive layer ADH2 is disposed on the first substrate SUB1. The second adhesive layer ADH2 is an optically clear adhesive (OCA) which allows light to be transmitted therethrough. The second adhesive layer ADH2 has a light refractive index from 1.3 to 1.8. The light refractive Indices of the first adhesive layer ADH1 and the second adhesive layer ADH2 may be equal to or different from each other.

Referring to FIGS. 1 to 6, according to embodiments, the light control layer LCL is disposed on the second adhesive layer ADH2, and the second substrate SUB2 is disposed on the light control layer LCL. The first light blocking parts LB1 and the second light blocking parts LB2 are attached to the second adhesive layer ADH2. The first light blocking parts LB1 and the second light blocking parts LB2 are alternately arranged on the second adhesive layer ADH2, and the first width d1 of the first light blocking parts LB1 and the second width d2 of the second light blocking parts LB2 differ from each other. The light transmitting layer TL forms the light control layer LCL and surrounds the first light blocking parts LB1 and the second light blocking parts LB2.

The light control panel LCP In accordance with an embodiment of the present disclosure is provided in the display panel DP, so that an occurrence of a moire phenomenon in the display device DD can be reduced, and the viewing angle of an image output from the display device DD can be variously controlled.

According to embodiments, the display device DD is appropriate for a vehicle. Specifically, the display device DD can be located at a lower side of a windshield of the vehicle, to display various information to a driver.

Figure 7:
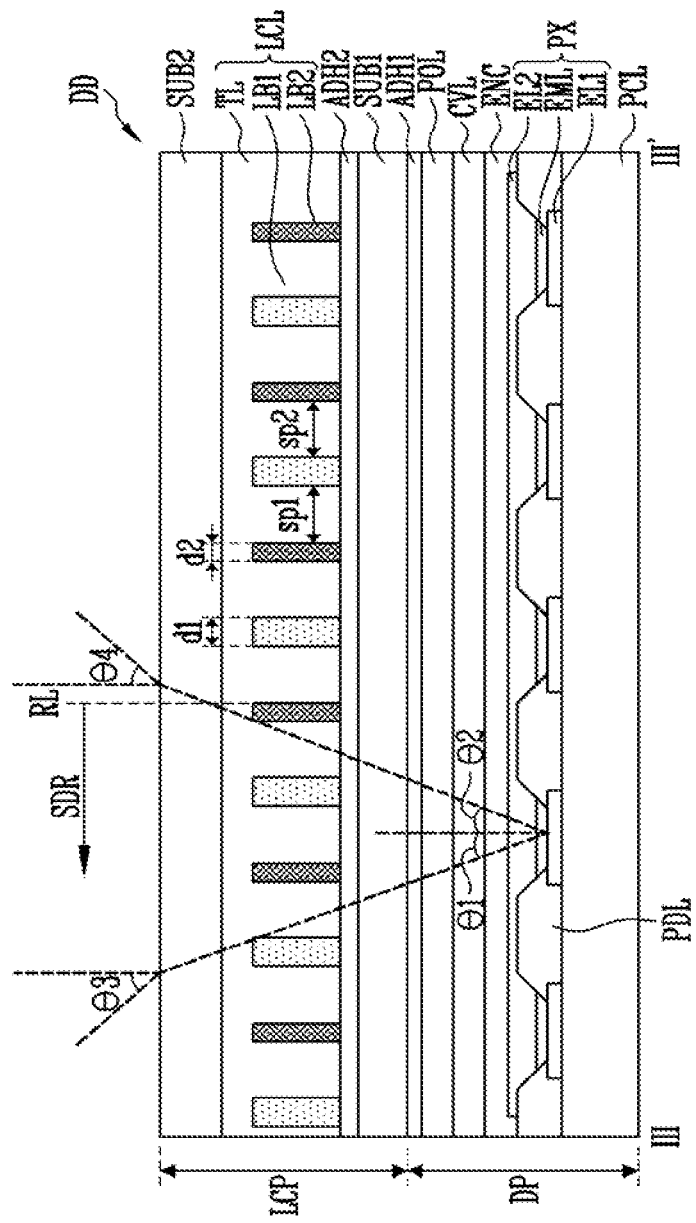
FIG. 7 illustrates a method of simulating viewing angles of a light control panel in accordance with an embodiment of the present disclosure.
Figure 8A:
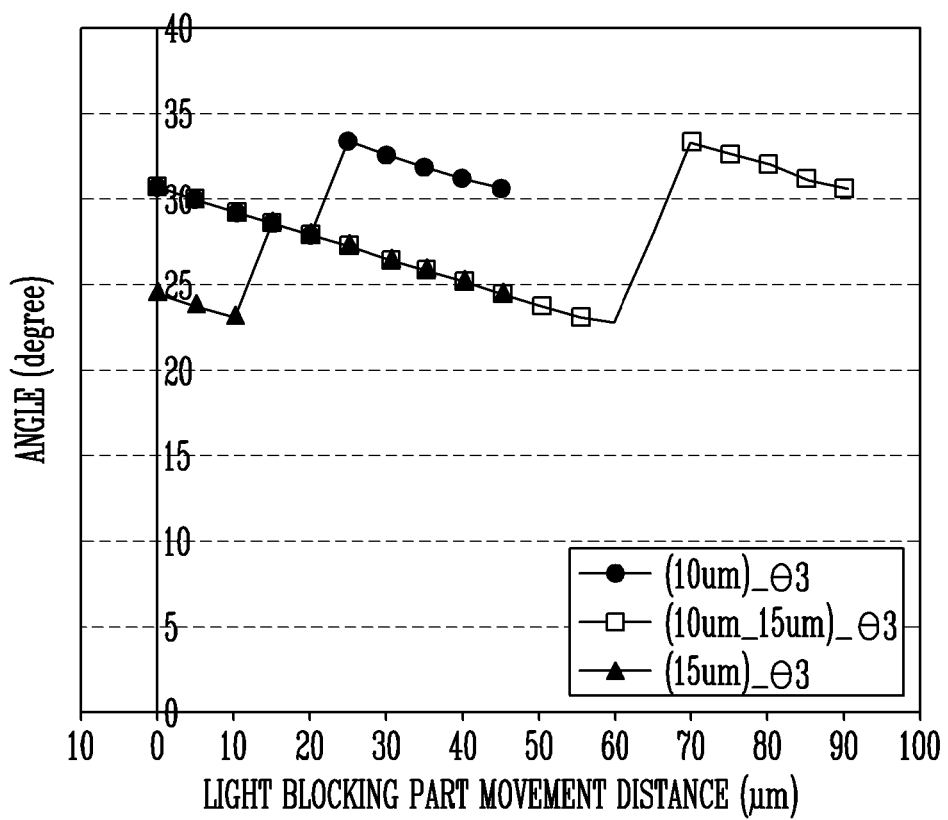
FIGS. 8A and 8B are graphs of viewing angle simulation results of a light control panel in accordance with an embodiment of the present disclosure.
Figure 8B:
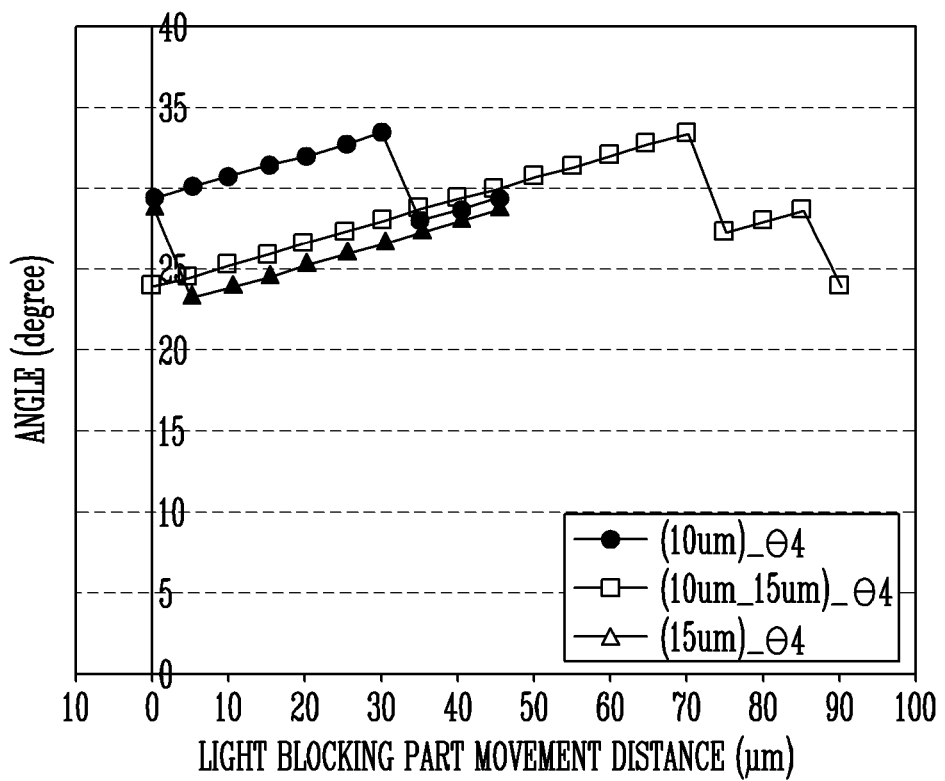

FIG. 7 illustrates a method of simulating viewing angles of a light control panel in accordance with an embodiment of the present disclosure. FIGS. 8A and 8B are graphs of viewing angle simulation results of a light control panel in accordance with an embodiment of the present disclosure.

As shown in FIG. 7, according to embodiments, through a simulation, viewing angles θ3 and θ4 were measured, which are angles of light emitted from the organic emitting layer EML of the pixel PX through the light control panel LCP.

Specifically, according to embodiments, by emitting at an angle θ1, the angle θ3 was derived, which is a maximum viewing angle at which light emitted from the organic emitting light EML through the light control panel LCP can be recognized by an experimenter. In addition, by emitting at an angle θ2, the angle θ4 was derived, which is a maximum viewing angle at which light emitted from the organic emitting light EML through the light control panel LCP can be recognized by the experimenter.

According to embodiments, a light refractive index of the second substrate SUB2 was set to 1.6, and a light refractive index of air was set to 1.0. In addition, a first width d1 of the first light blocking part LB1 was set to 15 μm, and a second width d2 of the second light blocking part LB2 was set to 10 μm. In addition, distances sp1 and sp2 between the first light blocking part LB1 and the second light blocking part LB2 were set to 60 μm.

Subsequently, according to embodiments, the viewing angles θ3 and θ4 with respect to a reference line RL were respectively derived while moving the first light blocking parts LB1 and the second light blocking parts LB2 by 5 μm along a simulation direction SDR.

In addition, according to embodiments, a simulation for deriving viewing angles θ3 and θ4 for a light control panel LCP that has only first light blocking parts LB1 in the light control layer LCL was performed identically to that of the above-described method. A light refractive index of the second substrate SUB2 was set to 1.6, and a light refractive index of air was set to 1.0. A first width d1 of the first light blocking part LB1 was set to 15 μm, and distances sp1 and sp2 between the first blocking parts LB1 were set to 60 μm.

4) In addition, according to embodiments, a simulation for deriving viewing angles θ3 and θ4 for alight control panel LCP that has only second light blocking parts LB2 in the light control layer LCL was performed identically to that of the above-described method. Alight refractive index of the second substrate SUB2 was set to 1.6, and a light refractive index of air was set to 1.0. A second width d2 of the second light blocking part LB2 was set to 10 μm, and distances sp1 and sp2 between the second blocking parts LB2 were set to 60 μm.

Results of the three simulations performed using the above-described methods are shown in Tables 1 and 2.

TABLE 1

| | Light blocking part movement distance (μm) | | | | | | | | | |
|---|---|---|---|---|---|---|---|---|---|---|
| | 0 | 5 | 10 | 15 | 20 | 25 | 30 | 35 | 40 | 45 |
| Second light blocking part (10 μm) θ3 | 30.7 | 30.0 | 29.3 | 28.6 | 27.9 | 33.4 | 32.6 | 31.9 | 31.2 | 30.7 |

TABLE 1-continued

| | \multicolumn{10}{c}{Light blocking part movement distance (μm)} | | | | | | | | | |
|---|---|---|---|---|---|---|---|---|---|---|
| | 0 | 5 | 10 | 15 | 20 | 25 | 30 | 35 | 40 | 45 |
| Second light blocking part (10 μm) θ4 | 29.3 | 30.0 | 30.7 | 31.2 | 31.9 | 32.6 | 33.4 | 27.9 | 28.6 | 29.3 |
| First light blocking part (15 μm) & second light blocking part (10 μm) θ3 | 30.7 | 30.3 | 29.3 | 28.6 | 27.9 | 27.2 | 26.5 | 25.8 | 25.1 | 24.5 |
| First light blocking part (15 μm) & second light blocking part (10 μm) θ4 | 23.8 | 24.5 | 25.1 | 25.8 | 26.5 | 27.2 | 27.9 | 28.6 | 29.3 | 30.0 |
| First light blocking part (15 μm) θ3 | 24.5 | 23.8 | 23.1 | 28.6 | 27.9 | 27.2 | 26.5 | 25.8 | 25.1 | 24.5 |
| First light blocking part (15 μm) θ4 | 28.6 | 23.1 | 23.8 | 24.5 | 25.1 | 25.8 | 26.5 | 27.2 | 27.9 | 28.6 |

TABLE 2

| | \multicolumn{9}{c}{Light blocking part movement distance (μm)} | | | | | | | | |
|---|---|---|---|---|---|---|---|---|---|
| | 50 | 55 | 60 | 65 | 70 | 75 | 80 | 85 | 90 |
| Second light blocking part (10 μm) θ3 | — | — | — | — | — | — | — | — | — |
| Second light blocking part (10 μm) θ4 | — | — | — | — | — | — | — | — | — |
| First light blocking part (15 μm) & second light blocking part (10 μm) θ3 | 23.8 | 23.1 | 22.8 | 27.9 | 33.4 | 32.6 | 32.1 | 31.2 | 30.7 |
| First light blocking part (15 μm) & second light blocking part (10 μm) θ4 | 30.7 | 31.2 | 31.9 | 32.6 | 33.4 | 27.2 | 27.9 | 28.6 | 23.8 |
| First light blocking part (15 μm) θ3 | — | — | — | — | — | — | — | — | — |
| First light blocking part (15 μm) θ4 | — | — | — | — | — | — | — | — | — |

Sums of the viewing angles θ3 and θ4 according to the results of the three simulations performed using the above-described methods are shown in Tables 3 and 4.

TABLE 3

| | Light blocking part movement distance (μm) | | | | | | | | | |
|---|---|---|---|---|---|---|---|---|---|---|
| | 0 | 5 | 10 | 15 | 20 | 25 | 30 | 35 | 40 | 45 |
| Second light blocking part (10 μm) θ3 + θ4 | 60.0 | 60.0 | 60.0 | 59.8 | 59.8 | 66.0 | 66.0 | 59.8 | 59.8 | 60.0 |
| First light blocking part (15 μm) & second light blocking part (10 μm) θ3 + θ4 | 54.5 | 54.5 | 54.4 | 54.4 | 54.4 | 54.4 | 54.4 | 54.4 | 54.4 | 54.4 |
| First light blocking part (15 μm) θ3 + θ4 | 53.1 | 46.9 | 46.9 | 53.1 | 53.0 | 53.0 | 510 | 53.0 | 53.0 | 53.1 |

TABLE 4

| | Light blocking part movement distance (μm) | | | | | | | | | |
|---|---|---|---|---|---|---|---|---|---|---|
| | 50 | 55 | 60 | 65 | 70 | 75 | 80 | 85 | 90 | Average |
| Second light blocking part (10 μm) θ3 + θ4 | — | — | — | — | — | — | — | — | — | 61.1 |
| First light blocking part (15 μm) & second light blocking part (10 μm) θ3 + θ4 | 54.5 | 54.3 | 54.7 | 60.5 | 66.7 | 59.8 | 60.0 | 59.8 | 54.5 | 56.3 |
| First light blocking part (15 μm) θ3 + θ4 | — | — | — | — | — | — | — | — | — | 51.8 |

FIGS. 8A and 8B are graphs of viewing angle simulation results of a light control panel in accordance with an embodiment of the present disclosure. Specifically, FIG. 8A illustrates, a simulation result with respect to the viewing angle θ3 in Tables 1 and 2, and FIG. 8B illustrates a simulation result with respect to the viewing angle θ4 in Tables 1 and 2.

Referring to Tables 1 to 4 and FIGS. 8A and 8B, according to embodiments, it can be seen that the light control panel LCP in accordance with an embodiment of the present disclosure is provided in the display panel DP, so that the viewing angle of the display device DD can be more variously and easily controlled.

That is, as compared with a light control panel with regularly arranged single light blocking parts, the light control panel LCP that Includes first light blocking parts and second light blocking parts can more precisely control the viewing angle thereof. Further, in accordance with the light control panel LCP, light emitted different directions is mixed, so that a moire phenomenon can be reduced.

In accordance with embodiments of the present disclosure, a light control panel is provided that can reduce a moire phenomenon and secure various viewing angles, and a display device is provided that includes the light control panel.

In accordance with embodiments of the present disclosure, a first light blocking layer and a second light blocking layer that are included in a light control panel have different widths, so that a moire phenomenon can be suppressed and various viewing angles can be secured.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, or elements described in connection with a particular embodiment may be used singly or in combination with features, characteristics, or elements described in connection with other embodiments unless otherwise specifically indicated. Accordingly, it will be understood by those of skill in the art that various changes in form and details may be made without departing from the spirit and scope of embodiments of the present disclosure as set forth in the following claims.

What is claimed is:

1. A light control panel, comprising:
    a first substrate;
    a light control layer that includes first light blocking parts and second light blocking parts that are disposed on the first substrate, extend along a first direction, and are spaced apart from each other along a second direction that crosses the first direction; and
    a second substrate disposed on the light control layer,
    wherein the first light blocking parts and the second light blocking parts are alternately arranged along the second direction,
    wherein each of the first light blocking parts has a first width in the second direction that is constant along a height of the first light blocking parts in a third direction normal to a plane defined by the first and second directions, each of the second light blocking parts has a second width in the second direction that is constant along a height of the second light blocking parts in the third direction, and the first width differs from the second width.

2. The light control panel of claim 1, wherein a first distance in the second direction between a first light blocking part adjacent to a first side of a second light blocking part and the second light blocking part differs from a second distance in the second direction between another first light blocking part adjacent to a second side of the second light blocking part and the second light blocking part.

3. The light control panel of claim 2, wherein each of the first distance and the second distance ranges from 10 µm to 75 µm.

4. The light control panel of claim 1, wherein each of the first width and the second width ranges from 5 µm to 20 µm, and wherein a ratio of the height of each of the first light blocking parts in the third direction to the first width and a ratio of The height of each of the second light blocking parts in the third direction to the second width range from 5:1 to 20:1.

5. The light control panel of claim 1, wherein the first light blocking parts and the second light blocking parts include different light absorbing materials.

6. The light control panel of claim 1, wherein each of the first substrate and the second substrate has a light refractive index that ranges from 1.3 to 1.8.

7. The light control panel of claim 1, wherein the light control layer further includes a light transmitting layer disposed between the first substrate and the second substrate,
    wherein the light transmitting layer forms the light control layer and surrounds the first light blocking parts and the second light blocking parts.

8. The light control panel of claim 7, wherein a light refractive index of the second substrate is greater than that of the light transmitting layer.

9. The light control panel of claim 1, wherein the light control layer further includes third light blocking parts respectively disposed between a first light blocking part and a second light blocking part of adjacent pairs of the first light blocking parts and the second light blocking parts, wherein each of the third light blocking parts has a third width in the second direction that is constant along a height of the third ligth blocking parts in the third direction, and the third width differs from teh first width and the second width.

10. A display device comprising:
    a light control panel,
    wherein the light control panel includes:
    a first substrate;
    a light control layer that includes first light blocking parts and second light blocking parts that are disposed on the first substrate, extend along a first direction, and are spaced apart from each other along a second direction that crosses the first direction; and
    a second substrate disposed on the light control layer,
    wherein the first light blocking parts and the second light blocking part are alternately arranged along the second direction,
    wherein each of the first light blocking parts has a first width in the second direction that is constant along a height of the first light blocking parts in a third direction normal to a plane defined by the first and second directions, each of the second light blocking parts has a second width in the second direction that is constant along a height of the second light blocking parts in the third direction,
    wherein a first distance in the second direction between a first light blocking part adjacent to a first side of a second light blocking part and the second light blocking part differs from a second distance in the second direction between another first light blocking part adjacent to a second side of the second light blocking part and the second light blocking part.

11. The display device of claim 10, further comprising:
    a display panel that includes a plurality of pixels, wherein the light control panel is disposed on the display panel,
    wherein each of the plurality of pixels includes:
    a first electrode;
    a second electrode disposed opposite from the first electrode; and
    an organic emitting layer disposed between the first electrode and the second electrode.

12. The display device of claim 10, wherein the first width of each of the first light blocking parts in the second direction differs from the second width of each of the second light blocking parts in the second direction, wherein each of the first width and the second width is 5 µm or more and 20 µm or less.

13. The display device of claim 10, wherein each of the first distance and the second distance ranges from 10 µm to 75 µm.

14. The display device of claim 12, wherein a ratio of a height of each of the first light blocking parts in a third direction normal to a plane defined by the first and second directions to the first width and a ratio of a height of each of the second light blocking parts in the third direction to the second width range from 5:1 to 20:1.

15. The display device of claim 10, wherein the first substrate and the second substrate have a light refractive index that ranges from 1.3 to 1.8.

16. The display device of claim 10, wherein the light control layer further includes a light transmitting layer disposed between the first substrate and the second substrate,
wherein the light transmitting layer forms the light control layer and surrounds the first light blocking parts and the second light blocking parts.

17. The display device of claim 16, wherein a light refractive index of the second substrate is greater than that of the light transmitting layer.

18. The display device of claim 10, wherein the light control layer further includes third light blocking parts respectively disposed between a first light blocking part and a second light blocking part of adjacent pairs of the first light blocking parts and the second light blocking parts, wherein each of the third light blocking parts has a third width in the second direction that is constant along a height of the third light blocking parts in the third direction, and the third width differs from the first width and the second width.

19. A light control panel, comprising:
a first substrate; and
a light control layer that includes first light blocking parts and second light blocking parts that are alternately disposed on the first substrate, extend along a first direction, and are spaced apart from each other along a second direction that crosses the first direction,
wherein each of the first light blocking parts has a first width in the second direction that is constant along a height of the first light blocking parts in a third direction normal to a plane defined by the first and second directions, each of the second light blocking parts has a second width in the second direction that is constant along a height of the second light blocking parts in the third direction, and the first width differs from the second width, and
wherein a ratio of the height of each of the first light blocking parts in the third direction to the first width and a ratio of the height of each of the second light blocking parts in the third direction to the second width range from 5:1 to 20:1.

20. The light control panel of claim 19, further comprising a second substrate disposed on the light control layer,
wherein a first distance in the second direction between a first light blocking part adjacent to a first side of a second light blocking part and the second light blocking part differs from a second distance in the second direction between another first light blocking part adjacent to a second side of the second light blocking part and the second light blocking part.

* * * * *